US008593846B2

(12) United States Patent
Helsley et al.

(10) Patent No.: US 8,593,846 B2
(45) Date of Patent: Nov. 26, 2013

(54) ANALOG FLOATING GATE CHARGE LOSS COMPENSATION CIRCUITRY AND METHOD

(75) Inventors: David A. Helsley, Tucson, AZ (US); Allan T. Mitchell, Heath, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 13/199,002

(22) Filed: Aug. 17, 2011

(65) Prior Publication Data

US 2013/0043934 A1 Feb. 21, 2013

(51) Int. Cl.
*G11C 27/00* (2006.01)

(52) U.S. Cl.
USPC ........................................ 365/45; 365/185.24

(58) Field of Classification Search
USPC .............................................. 365/45, 185.24
See application file for complete search history.

(56) References Cited

U.S. PATENT DOCUMENTS

| | | | |
|---|---|---|---|
| 5,059,920 A | 10/1991 | Anderson et al. | 330/253 |
| 5,875,126 A | 2/1999 | Minch et al. | 365/188.01 |
| 6,894,928 B2 | 5/2005 | Owen | 365/185.14 |
| 7,616,423 B2 * | 11/2009 | Miyazawa | 361/100 |
| 2006/0258094 A1 * | 11/2006 | Forbes | 438/257 |
| 2006/0267071 A1 * | 11/2006 | Carver et al. | 257/315 |
| 2006/0285374 A1 * | 12/2006 | Szeto et al. | 365/49 |

OTHER PUBLICATIONS

"A Very High Precision 500-nA CMOS Floating-Gate Analog Voltage Reference" by Ahuja et al., IEEE Journal of Solid-State Circuits, vol. 40, No. 12, Dec. 2005, pp. 2364-2372.
"High-Precision Analog EEPROM with Real-Time Write Monitoring" by Wee et al., IEEE, 2001, pp. I-105-I-108.
"Intersil Data Sheet for ISL21009 High Voltage Input Precision, Low Noise FGA™ Voltage References", Intersil, Sep. 12, 2007, pp. 1-19.

* cited by examiner

*Primary Examiner* — Michael Tran
(74) *Attorney, Agent, or Firm* — Alan A. R. Cooper; W. James Brady, III; Frederick J. Telecky, Jr.

(57) ABSTRACT

An analog floating gate circuit (10-3, 10-4) includes a first sense transistor (21, 3), a first storage capacitor (20, 5), and first (24, 4) and second (31A, 42) tunneling regions. Various portions of a first floating gate conductor (12, 2) form a floating gate of the first sense transistor, a floating first plate of the first storage capacitor (20, 5), a floating first plate of the first tunneling region, and a floating first plate of the second tunneling region, respectively. A second plate of the first storage capacitor is coupled to a first reference voltage ($V_{REF}$, GND), and a second plate of the second tunneling region is coupled to a second reference voltage ($V_{PROG}$/GND). Compensation circuitry (44-1, 44-2) is coupled to the first floating gate conductor, for compensating loss of trapped charge from the first floating gate conductor.

18 Claims, 3 Drawing Sheets

US 8,593,846 B2

1

ANALOG FLOATING GATE CHARGE LOSS COMPENSATION CIRCUITRY AND METHOD

BACKGROUND OF THE INVENTION

The present invention relates generally to AFG (analog floating gate) circuits, and more particularly to circuits that compensate for loss of charge stored on analog floating gates used in extremely low power integrated circuits, such as voltage reference circuits.

Floating gate field effect transistors have long been used as digital memory elements. More recently, floating gate field effect transistors have been used in extremely low power analog integrated circuits, such as precision voltage reference circuits.

FIG. 1 shows a conventional EEPROM (electrically erasable programmable read only memory) cell 1 which includes a N-channel floating gate MOS (metal oxide semiconductor) field effect transistor or "sense transistor" or "read transistor" 3 having a floating gate electrode 2 disposed on a thin oxide layer over the channel region of the transistor. EEPROM memory is designed to retain a sufficient level of charge on the floating gate MOS transistor over the desired lifetime of the memory that an undesired change of a stored state due to lost charge never occurs. Some charge may be lost from the floating gate of the EEPROM cell 1, but never enough to switch the stored state. Floating gate 2 typically is composed of suitably doped polycrystalline silicon, and the thin oxide layer typically is roughly 70 Angstroms to 120 Angstroms thick. A portion of floating gate 2 functions as one plate of a "control gate" capacitor 5, the other plate of which is connected to a control gate terminal 7 on which a control gate voltage $V_{CG}$ may be applied.

A portion of floating gate 2 also is connected to one plate of a thin oxide capacitor 4 which is referred to as a "tunneling region". The other plate of tunneling region 4 is connected to a terminal 6 on which a programming voltage $V_{TG}$ may be applied to permanently or semi-permanently write a "1" or a "0" voltage level onto floating gate 2.

Control gate capacitor 5 has a larger capacitance than tunneling region 4 and sense transistor 3. The larger capacitance of control gate capacitor 5 allows the voltage on floating gate 2 to be controlled by means of control gate terminal 7. The amount of voltage control one has over the floating gate 2 depends on the voltage coupling to floating gate 2 from control gate terminal 7. The coupling is equal to the capacitance of control gate 5 divided by the total capacitance of floating gate 2. Control gate capacitor 5 has a large capacitive voltage coupling from terminal 7 to floating gate 2. Therefore, the amount of charge tunneling through control gate capacitor 5 is small. That is, the voltage $V_{CG}$ on terminal 7 minus the voltage on floating gate 2 is small, e.g., less than 10% of $V_{CG}-V_{TG}$. Stated differently, the voltage on floating gate 2 follows the control gate voltage $V_{CG}$.

The amount of tunneling through tunneling region 4 depends on the amount of voltage drop across its tunneling oxide, with a higher voltage drop across tunneling region 4 causing a larger amount of tunneling current through it and vice versa. Tunnel gate capacitor 4 has a relatively small capacitive voltage coupling between terminal 6 and floating gate 2, so the amount of charge tunneling through tunnel gate capacitor 4 is relatively large compared to the amount of charge tunneling through control gate capacitor 5. That is, the voltage $V_{TG}$ on terminal 6 minus the voltage on floating gate 2 is relatively large, e.g., typically approximately 90% of $V_{CG}-V_{TG}$.

2

FIG. 1 also shows an optional P-channel (or N-channel) floating gate MOS transistor 9 having its floating (i.e., electrically isolated) gate connected to and continuous with floating gate 2 of sense transistor 3 for the purpose of providing faster hot electron injection programming of a "0" or "low" voltage level onto floating gate 2 than may be achieved by use of tunneling region 4. It is possible to use P-channel (or N-channel) floating gate transistor 9 to accomplish HCI (hot carrier injection) programming. Both options inject electrons onto floating gate 2, causing negative voltage bias thereon. However, using a P-channel transistor as floating gate transistor 9 allows use of a lower programming voltage.

FIG. 2 shows a "conceptual" equivalent circuit that may be helpful in understanding tunneling region 4 in FIG. 1. Tunneling region 4 may be conceptualized as a capacitor 4A coupled in parallel with back-to-back zener diodes 4B and 4C, as shown. A circuit symbol for tunneling region 4 is shown to the right of the conceptual equivalent circuit. A current tunnels from a first plate of capacitor 4A through a thin oxide (i.e., a "tunnel oxide") to a second plate of capacitor 4A if sufficient voltage is applied across the tunneling oxide of capacitor 4A to cause charge to flow through its tunneling oxide to the first plate of capacitor 4A. The tunneling current may be thought of as electrons (e⁻) flowing from the first plate to the second plate of capacitor 4A if the zener voltage of one of zener diodes 4B or 4C is exceeded. The charge resulting from the tunneling current then remains trapped on the second plate of capacitor 4A as long as the applied voltage between the two terminals of the tunneling region is kept below the threshold voltage of the tunnel oxide.

Referring again to FIG. 1, the programming accuracy of, and charge "loss" from, floating gate 2 of sense transistor 3 in EEPROM cell 1 are not a significant problem as long as the stored potential on floating gate 2 is sufficient to keep read transistor 3 in a preset "1" state or a preset "0" state. The term "charge loss" as used herein may refer to either an undesired increase or an undesired decrease in the amount of charge trapped/stored on the floating gate. In EEPROM memory a negative (electrons) or positive (holes) charge may be stored on the floating gate, so a net negative or a net positive charge may be lost. That may erroneously switch the stored logic state from a "1" to a "0" or visa versa, depending on the reference voltage used for detection of the stored logic level.

Sense transistor 3 in Prior Art FIG. 1 also may be used in an analog circuit. However, in AFG (analog floating gate) circuit applications, both the programming accuracy of the amount of charge stored on a floating gate and the amount of undesired charge "loss" from the electrically floating gate in an analog circuit application may be problematic because the resulting voltage of the floating gate directly and continuously affects the achievable accuracy of the application circuit in which the floating gate transistor 3 is used. This is in contrast to EEPROM circuits, in which a small increase or decrease in the amount of trapped charge has no effect on the stored "1" or "0" state except in the narrow transition region between an "on" condition and an "off" condition of the read transistor.

Charge stored on a floating gate creates a voltage difference between the floating gate (i.e., the floating plate of a tunneling region or a control gate capacitor) and a reference plate of the tunneling region or control gate capacitor. The floating gate voltage is determined mainly by a reference voltage applied to the control gate terminal 7 and by old that the charge stored on the floating gate 2. The voltages applied to the other terminal (of sense transistor 3 and tunnel region terminal 6) have a smaller impact due to their smaller capacitance. The equation for floating gate voltage is given by:

$$V_{fg} = Kcg*Vcg + Ktg*Vtg + Ks*V_{ss} + Kd*Vsd + Kb*Vbs + Q/Ctotal,$$

where each of the "K" values refers to the coupling coefficient for a corresponding terminal associated with the floating gate and is given by the capacitance of that terminal divided by the total capacitance Ctotal of the floating gate, and where:

Vfg is the floating gate voltage,
Kcg is the control gate capacitance divided by total capacitance,
Vcg is the control gate voltage,
Ktg is the tunnel gate capacitance divided by total capacitance,
Vtg is the tunnel gate voltage,
Ks is the floating gate overlap of source capacitance,
Vss is the source voltage,
Kd is the floating gate overlap of drain capacitance,
Vsd is the drain voltage,
Kb is the floating gate overlap of transistor channel (bulk) capacitance,
Vbs is the bulk voltage,
Q is the charge on the floating gate, and
Ctotal is equal to the sum of the control gate capacitance, the tunnel gate capacitance, the source overlap capacitance, the drain overlap capacitance, and the bulk overlap capacitance.

If some or all of the charge trapped on the floating gate 2 is lost (i.e., unintentionally modified/degraded), the effective threshold voltage of sense transistor 3 changes. This, of course, may cause an unacceptable loss in the accuracy of analog circuitry in which floating gate transistor 3 is used.

The mechanisms that may cause loss of charge from a floating gate include FNT (Fowler-Nordheim Tunneling), SILC (stress induced leakage current), mobile ion contamination, and/or HCI (Hot Carrier Injection). Providing additional charge onto the floating gate is usually accomplished by FNT tunneling. FNT tunneling may be used for the AFG (analog floating gate) applications described herein and also for other known voltage reference circuits. HCI is common in OTP (one time programmable) memory, and flash memory. FNT tunneling may be considered to be a high voltage process. For a 70 Angstrom tunneling oxide, roughly 12 volts applied for a duration of approximately 100 milliseconds may be used to program the floating gate. Electrons may be tunneled onto the floating gate by applying roughly 12 volts to the control gate and grounding the tunnel gate, or alternatively, electrons may be tunneled away from the floating gate by applying roughly 12 volts to the tunnel gate and grounding the control gate, depending on whether the resulting charge on the floating gate needs to be increased or decreased. Thus, FNT tunneling may be used to accomplish both programming and erasing of the floating gate voltage.

The other common way of programming a floating gate is by using hot carrier injection. This is accomplished by injecting high-energy electrons through the gate oxide of a sensing transistor, rather than by using a FNT charge tunneling mechanism. A typical voltage used to accomplish hot carrier injection is approximately 5 to 6 volts on the drain of a P-channel MOS programming transistor, such as transistor 9 in FIG. 1, to cause injection of hot electrons onto the floating gate. (More specifically, the bulk and drain electrodes of the programming transistor are connected together and the source electrode is grounded.) This has the effect of increasing the effective threshold voltage of a N-channel sense transistor (e.g., transistor 3 in FIG. 1) so that a greater positive gate-to-source voltage is required to turn it on. As long as the drain voltage of the sense transistor does not exceed approximately 5 to 6 volts, essentially no change in its floating gate charge will occur.

FNT tunneling may be used to provide any charge on the floating gate, typically to provide an amount of charge that results in a floating gate voltage in the range of roughly −5 volts to +5 volts. In contrast, hot electron injection may only be used to program or increase the threshold voltage of an N-channel sense transistor from an initial low level up to approximately 5 volts. (Hot electron injection makes the floating gate more negative with respect to ground, and therefore a higher control gate voltage then is required to turn on an N-channel sense transistor.) A common approach to programming of a floating gate is to program one polarity of the floating gate voltage by using hot electron injection and to program the other polarity using FNT tunneling. Several known AFG precision manufacturing process require 2 or 3 levels of polycrystalline silicon (hereinafter referred to as "poly") and associated additional masking steps to create unique tunneling structures. Consequently, use of the bipolar FNT tunneling technique as used in such structures is not very scalable to present state-of-the-art wafer fabrication processes.

The floating gate of an AFG device is capacitive in nature and therefore may be influenced by external capacitive coupling not only by means of a control gate capacitor, but also by other external capacitive coupling. A control gate voltage may be applied to one plate of the control gate capacitor, the other plate of which is part of the floating gate. Any charge introduced by any means onto and stored on the floating gate causes an offset to a voltage applied to the other plate of the control gate capacitor.

AFG technology has been used primarily in low power analog integrated circuit applications, including voltage reference circuits. In "nanopower" applications wherein the quiescent current needs to be less than a micrompere, the problem of providing accurate reference voltages is very important and challenging because the resistors of the voltage reference circuits must be very large, and consequently the associated thermal noise becomes unacceptably large. Conventional bandgap voltage reference circuits for generating accurate reference voltages usually consume substantial amounts of current, because reducing resistor noise in a bandgap voltage reference circuit typically requires increasing the amount of current therein (since the input-referred thermal noise is inversely proportional to the square root of current in the bandgap voltage reference circuit). For some applications, use of a AFG voltage reference circuit has been found to be a good practical solution to this problem.

FIG. 3 shows a basic prior art AFG-based precision voltage reference circuit 10-1. Voltage reference circuit 10-1 includes an error amplifier 11 having its (+) input coupled to a floating gate 12, part of which is shared with a first plate of a tunneling region 13. The (+) input of amplifier 11 is connected to the gate of a (+) input transistor (not shown) of amplifier 11. Another part of floating gate 12 forms a first plate of another tunneling region 14, and also forms a first plate of a reference or storage capacitor 15. The second plate of tunneling region 13 may be coupled to a positive programming voltage $V_{TRp1}$, and a second plate of tunneling region 14 may be coupled to a negative programming voltage $V_{TRn1}$. The second plate of reference capacitor 15 is connected to ground. The output 16 of voltage reference circuit 10-1 is the output reference voltage Vout=$V_{REF}$, and is connected to a first plate of a feedback capacitor 20, the second plate of which is connected to another floating gate conductor 17.

Part of floating gate 17 forms the gate of a (−) input transistor (not shown) of error amplifier 11. Another part of floating gate 17 forms a first plate of a tunneling region 18, and yet another part of floating gate 17 forms a first plate of another tunneling region 19. The second plate of tunneling region 18 may be coupled to a positive programming voltage $V_{TRp2}$, and the second plate of tunneling region 19 may be coupled to a negative programming voltage $V_{TRn2}$. In the prior art, both positive and negative tunneling regions conduct simultaneously under control of a feedback loop. This simultaneous conduction approach to programming of floating gate voltages results in accuracy sufficient for precision analog use, but requires some additional process complexity for the tunneling structure.

AFG-based voltage reference circuit 10-1 of FIG. 3 may be used to replace a conventional bandgap voltage reference circuit. Those skilled in the art know that a bandgap reference voltage is established by the difference between a pair of bipolar transistor collector currents. Most of the noise generated in a conventional bandgap voltage reference circuit is caused by the two collector currents, and it is necessary to increase those collector currents in order to reduce the noise of the bandgap voltage reference circuit. In contrast, the tunneled charge for AFG-based voltage reference circuit 10-1 is stored on a floating gate rather having a reference voltage maintained by flow of current through a resistance, so there are no bipolar transistor collector currents and therefore no shot noise. Furthermore, a bandgap voltage inherently is a fixed voltage determined by the bandgap of the semiconductor material and its temperature, whereas an AFG-based reference voltage is not fixed but is readily adjustable or programmable to any desired value.

FIG. 4 shows another conventional AFG-based voltage error or reference circuit 10-2 in which the output 16 of reference amplifier 11 generates an output reference voltage Vout=$V_{REF}$ and is connected to a first plate of feedback capacitor 20. The second plate of feedback capacitor 20 is formed by a portion of floating gate 12. Another part of floating gate 12 forms the (−) input transistor 22 of reference amplifier 11. C11 is the capacitance of the portion of floating gate 12 that forms the gate of input transistor 22. Floating gate 12 also forms a first plate of a tunneling region 24, a second plate of which is connected to ground. The capacitance of tunneling region 24 is C13. The voltage $V_{fg1}$ of floating gate 12 may be set to approximately Vout/2. The (+) input transistor 23 of reference amplifier 11 is a floating gate transistor, the gate of which is formed by a portion of floating gate 17. Floating gate 17 also forms a first plate of a tunneling region 25 and a first plate of a control gate capacitor (or reference capacitor or storage capacitor) 26. The second plate of tunneling region 25 and the second plate of control gate capacitor 26 are connected to ground. C21 is the capacitance of the gate portion of (+) input transistor 23. The capacitance of tunneling region 25 is C23, and the capacitance of control gate capacitor 26 is C22. The voltage $V_{fg2}$ of floating gate 17 also may be set to Vout/2. Input transistors 22 and 23 typically are MOS floating gate transistors connected in a differential configuration.

In FIG. 4, all of the gate oxides, tunnel region oxides and capacitor dielectric oxides may be "thin oxides", with thicknesses in the range about 70 to 120 Angstroms. The e− symbols and associated arrows indicate electrons tunneling through the various floating gate tunneling oxides in the directions indicated. In many of the likely circuit applications, analog floating gates are provided for both of the differential input transistors of the amplifier. The arrow and e− symbol next to storage capacitor 26 indicates that tunneling could occur in it because of the thin oxide.

The e− symbols indicate the direction of electron flow during normal operation and/or during shelf life. The minute amount of charge loss during powering up and down of the circuit is insignificant. The current flowing through the various capacitances in FIG. 4 depends on the electric fields across their associated oxides. When AFG-based voltage reference circuit 10-2 device is OFF (i.e., not powered up), the charge on the floating gates tends to leak off over time due to the electric fields caused by the charge stored on each floating gate. During operation, the electric fields across the various capacitances are different due to the different applied voltage biases. Under the influence of a bias voltage, electrons may flow onto a floating gate, instead of flowing from the floating gate. The electron flow will be in the direction toward the side of a capacitance which is biased at the higher voltage.

It is believed that the closest prior art is directed mainly to the initial programming of the analog floating gates and to long-term retention of the programmed charge on the floating gates. It also is believed that the prior art does not disclose passive or active direct compensation for loss of charge the analog floating gates which generally occurs over the product lifetime. When "indirect" compensation for loss of trapped charge on floating gates has been attempted, it is believed to have taken the form of either additional re-programming or re-calibration of analog floating gate circuits.

Thus, there is an unmet need for a circuit and method for compensating loss of trapped charge on a floating gate in an AFG (analog floating gate) circuit.

There also is an unmet need for a inexpensive circuit and method that makes it more practical for precision analog floating gate circuits to retain their accuracy over acceptable circuit lifetimes.

There also is an unmet need for a way to avoid the need to provide complex circuitry to compensate for undesired loss of charge on analog floating gates of AFG circuitry.

There also is an unmet need for a way to avoid calibration cycles or reprogramming cycles to compensate for undesired loss of charge on analog floating gates of AFG circuitry.

SUMMARY OF THE INVENTION

It is an object of the invention to provide a circuit and method for compensating loss of trapped charge on a floating gate in an AFG (analog floating gate) circuit.

It is another object of the invention to provide an inexpensive circuit and method that makes it more practical for precision analog floating gate circuits to retain their accuracy over acceptable circuit lifetimes.

It is another object of the invention to provide a practical way to avoid the need to provide complex circuitry to compensate for undesired loss of charge from analog floating gates of AFG circuitry.

It is another object of the invention to provide a way to avoid the need for calibration cycles or reprogramming cycles to compensate for undesired loss of charge from analog floating gates of AFG circuitry.

Briefly described, and in accordance with one embodiment, the present invention provides an analog floating gate circuit (10-3, 10-4) that includes a first sense transistor (21, 3), a first storage capacitor (20, 5), and first (24, 4) and second (31A, 42) tunneling regions. Various portions of a first floating gate conductor (12, 2) form a floating gate of the first sense transistor, a floating first plate of the first storage capacitor (20, 5), a floating first plate of the first tunneling region, and a floating first plate of the second tunneling region, respectively. A second plate of the first storage capacitor is coupled to a first reference voltage ($V_{REF}$, GND), and a second plate of the second tunneling region is coupled to a second reference voltage ($V_{PROG}$/GND). Compensation circuitry (44-1, 44-2) is coupled to the first floating gate conductor, for compensating loss of trapped charge from the first floating gate conductor.

In one embodiment, the invention provides an AFG (analog floating gate) circuit (10-3 of FIG. 5, 10-4 of FIG. 6), including a first sense transistor (21 or 23 of FIG. 5, 3 of FIG. 6), a first storage capacitor (20 or 26 of FIG. 5, 5 of FIG. 6), and first (24 or 25 of FIG. 5, 4 of FIG. 6) and second (31A or 30A of FIG. 5, 42 of FIG. 6) tunneling regions. Various portions of a first floating gate conductor (12 or 17 in FIG. 5, 2 in FIG. 6) form a floating gate of the first sense transistor (21 or 23 of FIG. 5, 3 of FIG. 6), a floating first plate of the first storage capacitor (20 or 26 of FIG. 5, 5 of FIG. 6), a floating first plate of the first tunneling region (24 or 25 of FIG. 5, 4 of FIG. 6), and a floating first plate of the second tunneling region (31A or 30A of FIG. 5, 42 of FIG. 6), respectively. A second plate of the first storage capacitor (20 or 26 of FIG. 5, 5 of FIG. 6) is coupled to a first reference voltage ($V_{REF}$ for 31A or GND for 26), and a second plate of the second tunneling region (31A or 30A of FIG. 5, 42 of FIG. 6) is coupled to a second reference voltage ($V_{PROG}$/GND for 31A, $V_{PROG}$/GND for 24). Compensation circuitry (44-1 of FIG. 5, 44-2 of FIG. 6) is coupled to the first floating gate conductor (12 or 17 in FIG. 5, 2 in FIG. 6), for compensating loss of charge on the first floating gate conductor (12 or 17 in FIG. 5, 2 in FIG. 6).

In one embodiment, the compensation circuitry includes passive compensation circuitry (44-1 of FIG. 5) which sets a predetermined voltage on the second plate of the first tunneling region (24 or 25 of FIG. 5) in response to a fixed voltage (e.g., $V_{PROG}$/GND) and functions as a reserve source of charge from which to compensate loss of charge from the first floating gate conductor (12 or 17). In one embodiment, the active compensation circuitry (44-2 in FIG. 6) includes a floating gate input transistor (48) for determining a voltage of the first floating gate conductor (2 in FIG. 6). Floating gate of the floating gate input transistor (48) is formed by a portion of the first floating gate conductor (2 in FIG. 6). The active compensation circuitry (44-2 in FIG. 6) operates in response to a voltage of the first floating gate conductor (2 in FIG. 6).

In one embodiment, the first sense transistor is an amplifier input transistor (21 or 23 in FIG. 5) of an amplifier (11).

In one embodiment, the compensation circuitry includes a passive compensation circuit (44-1 of FIG. 5) having a first capacitor (32A or 32B) coupled between the first reference voltage ($V_{PROG}$/GND for 31A or $V_{PROG}$/GND for 24) and the second plate of the first tunneling region (24 or 25 of FIG. 5). The second plate of the first tunneling region (24 or 25 of FIG. 5) is a portion of a second floating gate conductor (28A in FIG. 5). In one embodiment, the passive compensation circuit (44-1 of FIG. 5) includes the second floating gate conductor (28A) coupled to the second plate of the first tunneling region (24). A third tunneling region (34A or 34B) has a first plate coupled to the second floating gate conductor (28A) and a second plate coupled to the second reference voltage ($V_{PROG}$/GND for 31A, $V_{PROG}$/GND for 24), and a second storage capacitor (32A or 32B) has a first plate coupled to the second floating gate conductor (28A) and a second plate coupled to a third reference voltage (GND or any fixed reference). In one embodiment, the passive compensation circuit (44-1) includes a fourth tunneling region (31B or 30B) having a first plate coupled to the second floating gate conductor (28A) and a second plate coupled to a second reference voltage ($V_{PROG}$/GND for 31A, $V_{PROG}$/GND for 24).

In one embodiment, the first sense transistor is a first input transistor (21) of an amplifier (11). The amplifier (11) also includes a second sense transistor which is a second input transistor (23) of the amplifier (11). Various portions of a third floating gate conductor (17) form a floating gate of the second sense transistor (23), a floating first plate of a second storage capacitor (26), a floating first plate of a fifth tunneling region (25), and a floating first plate of a sixth tunneling region (30A), respectively. The second plate of the second storage capacitor (26) is coupled to the third reference voltage (GND or any fixed reference), and a second plate of the sixth tunneling region (30A) is coupled to the third reference voltage (GND or any fixed reference). The compensation circuit (44-1) includes a fourth floating gate conductor (28B) coupled to the second plate of the fifth tunneling region (25). A seventh tunneling region (34B) has a first plate coupled to the fourth floating gate conductor (28B) and a second plate coupled to the second reference voltage ($V_{PROG}$/GND for 31A, $V_{PROG}$/GND for 24). A fourth storage capacitor (32B) has a first plate coupled to the fourth floating gate conductor (28B) and a second plate coupled to the third reference voltage (GND or any fixed reference), and an eighth tunneling region (30B) has a first plate coupled to the fourth floating gate conductor (28B) and a second plate coupled to the second reference voltage ($V_{PROG}$/GND for 31A, $V_{PROG}$/GND for 24).

In one embodiment, the amplifier (11) is an error amplifier of a voltage reference circuit (10-3), wherein the first storage capacitor (20) is a feedback capacitor coupled between the first floating gate conductor (12) and an output (16) of the amplifier (11).

In one embodiment, voltages and charges on the second floating gate conductor (28A) are sufficient to cause the second tunneling region (24) to compensate for trapped charge loss on the first floating gate conductor (12) over a desired product lifetime.

In one embodiment, the active compensation circuitry (44-2 in FIG. 6) operates in response to a voltage of the first floating gate conductor (2 in FIG. 6) to adjust a voltage (Vout) of the second plate (6 in FIG. 6) of the first tunneling region (4 in FIG. 6) so as to automatically reduce an error in the voltage of the floating plate conductor (2) due to loss of trapped charge from the floating gate conductor (2).

In one embodiment, the invention provides a method of compensating charge loss from a floating gate conductor (12 or 17 in FIG. 5, 2 in FIG. 6) of an AFG (analog floating gate) circuit (10-3 of FIG. 5, 10-4 of FIG. 6), the method including providing a sense transistor (21 or 23 of FIG. 5, 3 of FIG. 6), a first storage capacitor (20 or 26 of FIG. 5, 5 of FIG. 6), and first (24 or 25 of FIG. 5, 4 of FIG. 6) and second (31A or 30A of FIG. 5, 42 of FIG. 6) tunneling regions, various portions of a first floating gate conductor (12 or 17 in FIG. 5, 2 of FIG. 6) forming a floating gate of the sense transistor (23 of FIG. 5, 3 of FIG. 6), a floating first plate of the first storage capacitor (20 or 26 of FIG. 5, 5 of FIG. 6), a floating first plate of the first tunneling region (24 or 25 of FIG. 5, 4 of FIG. 6), and a floating first plate of the second tunneling region (31A or 30A of FIG. 5, 42 of FIG. 6), respectively, a second plate of the first storage capacitor (20 or 26 of FIG. 5, 5 of FIG. 6) being coupled to a first reference voltage ($V_{PROG}$/GND for 31A or $V_{PROG}$/GND for 24), and a second plate of the second tunneling region (30A of FIG. 5, 42 of FIG. 6) being coupled to the first reference voltage ($V_{PROG}$/GND for 31A or $V_{PROG}$/GND for 24); and coupling compensation circuitry (44-1 of FIG. 5, 44-2 of FIG. 6) to a second plate of the first tunneling region (24 or 25 of FIG. 5, 4 of FIG. 6) to provide a source of charge through the first tunneling region (24 or 25 of FIG. 5, 4 of FIG. 6) to compensate loss of trapped charge from the first floating gate conductor (17 of FIG. 5, 2 of FIG. 6).

In one embodiment, the method includes setting a predetermined voltage on the second plate of the first tunneling region (24 or 25 of FIG. 5) by means of passive capacitor divider compensation circuitry (44-1 of FIG. 5) which functions as a reserve source of charge from which charge may tunnel as needed through the first tunneling region (24 or 25 of FIG. 5) to the first floating gate conductor (12 or 17 in FIG. 5).

In one embodiment, the method includes coupling a second storage capacitor (32A or 32B) between a second reference voltage ($V_{PROG}$/GND for 31A, $V_{PROG}$/GND for 24) and the second plate of the first tunneling region (24 or 25 of FIG. 5), the second plate of the first tunneling region (24 or 25 of FIG. 5) being a portion of a floating gate compensation conductor (28A for 24, 28B for 25) coupled to the second plate of the first tunneling region (24 or 25).

In one embodiment, the method includes operating active compensation circuitry (44-2 in FIG. 6) in response to a voltage of the first floating gate conductor (2 in FIG. 6) to adjust a voltage (Vout) of the second plate (6 in FIG. 6) of the first tunneling region (4 in FIG. 6) so as to automatically reduce an error in the voltage of the floating plate conductor (2) due to loss of trapped charge from the floating gate conductor (2).

In one embodiment, the method includes automatically adjusting an electric field across the first tunneling region (24 or 25 in FIG. 5, 4 in FIG. 6) so as to provide compensation for leakage of charge from the first floating gate conductor (12 or 17 in FIG. 5, 2 in FIG. 6) over a desired product lifetime.

In one embodiment, the invention provides an AFG (analog floating gate) circuit (10-3 of FIG. 5, 10-4 of FIG. 6), including a sense transistor (21 or 23 of FIG. 5, 3 of FIG. 6), a first storage capacitor (20 or 26 of FIG. 5, 5 of FIG. 6), and first (24 or 25 of FIG. 5, 4 of FIG. 6) and second (31A or 30A of FIG. 5, 42 of FIG. 6) tunneling regions, various portions of a first floating gate conductor (12 or 17 in FIG. 5, 2 of FIG. 6) forming a floating gate of the sense transistor (23 of FIG. 5, 3 of FIG. 6), a floating first plate of the first storage capacitor (20 or 26 of FIG. 5, 5 of FIG. 6), a floating first plate of the first tunneling region (24 or 25 of FIG. 5, 4 of FIG. 6), and a floating first plate of the second tunneling region (31A or 30A of FIG. 5, 42 of FIG. 6), respectively, a second plate of the first storage capacitor (20 or 26 of FIG. 5, 5 of FIG. 6) being coupled to a first reference voltage ($V_{PROG}$/GND for 31A or $V_{PROG}$/GND for 24), and a second plate of the second tunneling region (30A of FIG. 5, 42 of FIG. 6) being coupled to the first reference voltage ($V_{PROG}$/GND for 31A or $V_{PROG}$/GND for 24); and means (44-1 or 44-2) for coupling compensation circuitry (44-1 of FIG. 5, 44-2 of FIG. 6) to a second plate of the first tunneling region (24 or 25 of FIG. 5, 4 of FIG. 6) to provide a source of charge through the first tunneling region (24 or 25 of FIG. 5, 4 of FIG. 6) to compensate loss of trapped charge from the first floating gate conductor (17 of FIG. 5, 2 of FIG. 6).

DETAILED DESCRIPTION OF THE PREFERRED EMBODIMENTS

Figure 5:
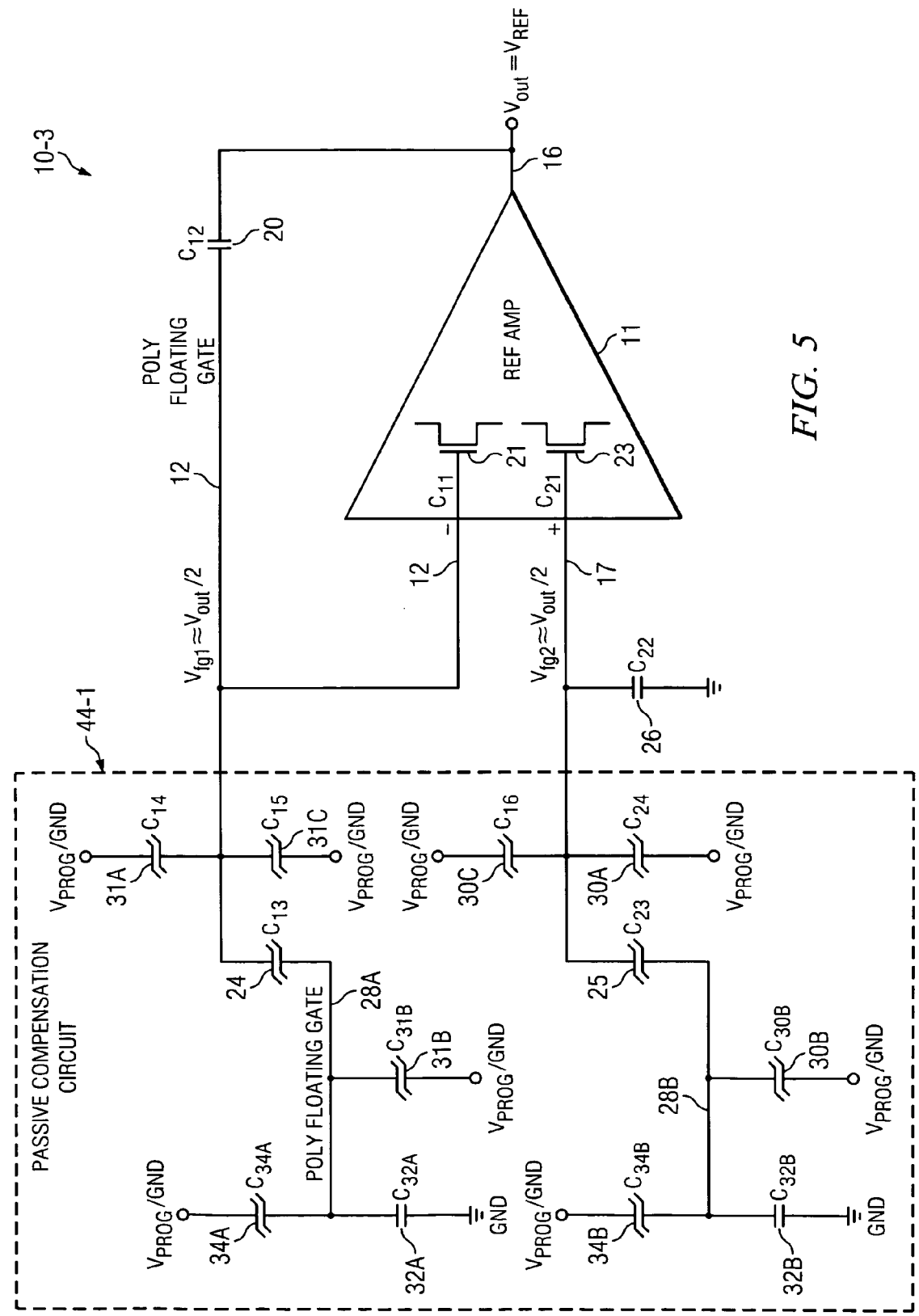
FIG. 5 is a schematic diagram illustrating a "passive" AFG charge loss compensation technique according to the present invention.

Referring to FIG. 5, AFG voltage reference circuit 10-3, which may be included in an analog integrated circuit chip, includes error or reference amplifier 11: Reference amplifier 11 has its (−) input connected to the gate of an input transistor 21 in reference amplifier 11 and has its (+) input connected to the gate of an input transistor 23. The gate of (−) input transistor 21 is formed by a portion of floating gate conductor 12. Floating gate 12 also forms a first plate of each of tunneling region 24, tunneling region 31A, tunneling region 31C, and feedback capacitor 20. The capacitances of (−) input transistor 21, (+) input transistor 23, and feedback capacitor 20 are C11, C21, and C12, respectively. The capacitances of tunneling regions 24, 31A, and 31C are C13, C14 and C15, respectively. The second plate of feedback capacitor 20 is connected by conductor 16 to the output of reference amplifier 11, which produces a reference voltage Vout=$V_{REF}$ on conductor 16. The second plate of each of tunneling regions 31A and 31C is connected to a suitable programming voltage $V_{PROG}$ during an initial programming phase to establish a desired value of the voltage $V_{fg1}$ on floating gate conductor 12. After the initial programming is complete, the second plate of each of tunneling regions 31A and 31C is connected to a suitable voltage such as GND (ground), in order to prevent those tunneling regions from interfering with proper compensation of the trapped charge on floating gate conductor 12 over the desired lifetime of the product. Therefore, in FIG. 5 the second terminal of each of the foregoing tunneling regions is illustrated as being connected to $V_{PROG}$/GND. The second plate of tunneling region 24 is connected to another floating gate 28A.

The gate of (+) input transistor 23 is formed by a portion of floating gate conductor 17. Floating gate conductor 17 also forms a first plate of a control gate capacitor 26, a first plate of a tunneling region 30A, a first plate of tunneling region 30C, and a first plate of a tunneling region 25. The second plate of each of tunneling regions 30A and 30C is connected to a suitable programming voltage $V_{PROG}$ during the initial programming phase to establish a desired value of the voltage $V_{fg2}$ on floating gate conductor 17. After the initial programming is complete, the second plate of each of tunneling regions 30A and 30C is connected to GND to prevent them from interfering with proper compensation of the trapped charge on floating gate conductor 17 over the desired product lifetime. The second plate of control gate capacitor 26 is coupled to ground or other suitable reference voltage. The second terminal of tunneling region 25 is connected to another floating gate 28B. The capacitances of tunneling regions 25, 30A, and 30B are C23, $C_{30B}$, and C24, respectively.

Control gate capacitor 26 is used to establish a ground reference during both circuit operation and the "programming" of floating gate 17. Control gate capacitor 26 has a substantially higher capacitance than all the other capacitors connected to floating gate 17.

Above mentioned floating gate 28A is also connected to a first plate of a tunneling region 34A, a first plate of a tunneling region 31B, and a first plate of a large control gate capacitor 32A used to establish a reference for both circuit operation and programming of floating gate 12. The second plate of tunneling region 31B is connected to $V_{PROG}$/GND. Capacitor 32A is another large control gate capacitor. The second terminal of tunneling region 34A is connected to $V_{PROG}$/GND and the second terminal of capacitor 32A is connected to ground or any suitable fixed reference voltage he. The capacitances of capacitor 32A and tunneling regions 34A and 31B are $C_{32A}$, $C_{34A}$, and $C_{31B}$, respectively.

Floating gate 28B is connected to a first plate of a tunneling region 34B, a first plate of a tunneling region 30B, and to a first plate of a large control gate capacitor 32B used to establish a reference for both circuit operation and programming of floating gate 28B. The second plate of tunneling region 30B is connected to $V_{PROG}$/GND. The second terminal of tunneling region 34B is connected to $V_{PROG}$/GND and the second terminal of control gate capacitor 32B is connected to ground or other suitable fixed reference voltage. The capacitances of capacitor 32B and tunneling regions 34B and 30B are $C_{32B}$, $C_{30B}$, and $C_{34B}$, respectively.

Note that during the initial programming phase, each of the programming voltages $V_{PROG}$ (all of which may have different values) has whatever value is required to produce the desired voltages on the corresponding floating gate conductor 12, 17, 28A or 28B as needed for the desired operation of voltage reference circuit 10-3. After the programming phase is complete, then, during normal circuit operation of voltage reference circuit 10-3, the second terminals of the various tunneling regions 31A, 31B, 31C, 34A, 30A, 30B, 30C and 34B are connected to GND (ground) or other suitable voltage which does not interfere with subsequent compensation of the trapped charge loss from any of the various floating gate conductors 12, 17, 28A or 28B.

Capacitors 32A, 32B, 26 and 20 preferably are thick oxide capacitors in order to reduce charge loss through the thick oxides. The remaining capacitors or tunneling regions are thin oxide devices.

The voltages on conductors 12 and 17 are equal to the common mode input voltage of reference amplifier 11 and may be equal, for example, to Vout/2. Floating gate conductors 28A and 28B may be referred to as "compensation nodes", and may be programmed so as to provide voltages that are different from the voltage on floating gate conductors 12 and 17. For example, these voltages may be higher than those on conductors 12 and 17 in order to induce a tunneling current in C13 and/or C23 that compensates for charge loss from conductors 12 and/or 17. During programming operation (e.g., when $V_{PROG}$ is applied to the second terminal of tunneling region 34A), the passive voltage divider formed by tunneling region 34A and control gate capacitor 32A causes tunneling region 34A to produce a desired voltage on floating gate conductor 28A. Similarly, the passive voltage divider formed by tunneling region 34B and control gate capacitor 32B causes tunneling region 34B to produce a desired voltage on floating gate conductor 28B. The voltages across tunneling regions 24 and 25 should be programmed so as to add suitable amounts of compensation charge to floating gate conductors 28A and 28B, respectively, in order to compensate for trapped charge loss through the various tunneling regions connected to floating gate conductors 28A and 28B over the desired product lifetime.

Another method of programming of AFG devices is to pulse the various tunneling regions with short, high-voltage pulses and then measure Vout=$V_{REF}$ to determine if the desired reference voltage value is achieved. If the measured value of Vout=$V_{REF}$ is too large after a pulse has been applied to the positive tunnel region, then a shorter high voltage pulse may be applied to the corresponding negative tunneling region to bring Vout back to a desired value. This technique causes the various tunneling regions to generate voltages on floating gate conductors 28A and 28B that are of substantially greater magnitude than the voltages (Vout/2 in the above described example) programmed onto floating gate conductors 12 and 17, respectively.

The effect of charging compensation node 28A by means of storage capacitor 32A and tunneling regions 34A and 31B is to provide an additional large source of charge from which to achieve FNT through tunneling region 24 to compensate loss of trapped charge on floating gate conductor 28A through tunneling regions 31A and 31C over the product lifetime. Similarly, the effect of charging compensation node 28B by means of storage capacitor 32B and tunneling regions 34B and 30B is to provide an additional large source of charge from which to achieve FNT through tunneling region 25 to compensate loss of trapped charge on floating gate conductor 28B through tunneling regions 30A and 30C over the product lifetime. Compensation nodes 28A and 28B act as a sources of charge that may be applied as needed to automatically compensate trapped charges which are gradually lost from analog floating gates 28A and 28B, respectively.

Thus, the voltages on floating gate conductors 12 and 17 are first programmed to whatever values are needed to generate the desired value of Vout=$V_{REF}$. Then voltages are programmed onto floating gate conductors 28A and 28B such that the voltages and corresponding electric fields across tunneling regions 24 and 25 cause them to compensate loss of trapped charge and thereby maintain the voltages on floating gate conductors 12 and 17 constant over the product lifetime.

More specifically, the charge/voltage on each of floating gate conductors 12 and 28A is set by a one-time (or several-time) programming procedure, using tunneling region 34A and/or tunneling region 31B to program the desired voltage onto floating gate conductor 12 and then using tunneling region 34A and/or tunneling region 31B to program a substantially higher voltage onto floating gate conductor 28A. Similarly, the charge/voltage on each of floating gate conductors 17 and 28B is set by a one-time (or several-time) programming procedure, using tunneling region 34B and/or tunneling region 30B to program the desired voltage onto floating gate conductor 17 and then using tunneling region 34B and/or tunneling region 30B to program a substantially higher voltage onto floating gate conductor 28B. The main purpose of charging compensation nodes 28A and 28B is to provide the voltage drops across tunneling regions 24 and 25 to establish the electric fields across the thin oxides of tunneling regions 24 and 25 which cause appropriate tunneling of compensation charge onto floating gates 12 and 17, respectively, at rates which compensate for any loss of trapped charges through the tunneling regions connected to floating gate conductors 12 and 28A and floating gate conductors 17 and 28B over the desired product lifetime.

Figure 6:
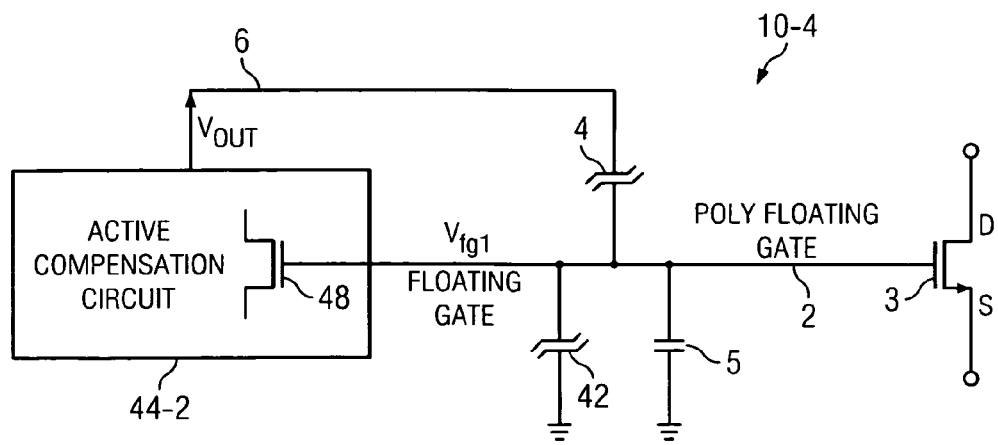
FIG. 6 is a schematic diagram illustrating an "active" AFG charge loss compensation technique according to the present invention.

FIG. 6 shows a generalized AFG circuit 10-4 that includes a transistor 3, which could be the input transistor of an amplifier such as reference amplifier 11 in FIG. 5. AFG circuit 10-4 also includes an active compensation circuit 44-2 which operates in response to the floating gate voltage $V_{fg1}$ on floating gate conductor 2 of MOS read transistor 3 so as to generate an output compensation voltage Vout. Vout is applied to the control plate 6 of a first tunneling region 4. The other plate of tunneling region 4 is formed by a portion of floating gate conductor 2. A relatively thick oxide storage capacitor 5 has a first plate formed by a portion of floating gate conductor 2 and a second plate connected to ground. A tunneling region 42 has a first plate connected to ground and a second plate formed by a portion of floating gate conductor 2. Active compensation circuit 44-2 includes a floating gate input transistor 48.

After initial programming of the desired voltage onto floating gate conductor, for example by using tunneling regions 4 and 42 generally in the manner previously described, active compensation circuit 44-2 operates to control the upper plate 6 of tunneling region 4 (in this example) to establish an electric field across the thin oxide of tunneling region 4 so as to cause it to continuously compensate the previously programmed voltage on floating gate conductor 2 for loss of trapped charge from floating gate conductor 2 over the product lifetime.

Active compensation circuit 44-2 senses the voltage $V_{fg1}$ on floating gate 2 and, if necessary, adjusts it by means of tunneling region 4. If Vout is equal to $V_{fg1}$, then no compensation for charge loss through tunneling region 42 is necessary. That is, if Vout on upper plate 6 of tunnel region 4 is equal to the voltage on floating gate conductor 2, then there is no present voltage across the thin oxide of tunneling region 4, and therefore no present compensation for loss trapped charge from a floating gate conductor 2 is needed. However, if Vout is not equal to the present voltage on floating gate conductor 2, then a non-zero electric field exists across the thin oxide of tunneling region 4, so a corresponding amount of compensation for charge lost from the floating gate conductor 2 will occur.

To accomplish this operation, active compensation circuit 44-2 compares the desired voltage on floating gate conductor 2 with the present actual voltage on floating gate conductor 2 and generates a value of Vout on upper plate 6 of tunneling region 4 that is proportional to the difference or error voltage between the desired and actual voltages for floating gate conductor 2. (One skilled in the art can readily provide a suitable error amplifier, which may include MOS transistor 48, in active compensation circuit 44-2 for amplifying the error voltage and generating the needed value of Vout on upper plate 6 of tunneling region 4.) The value of Vout corrects the error and thereby holds the voltage of floating gate 2 at a correct constant value over the life of an integrated circuit which includes AFG circuit 10-4. For example, as the floating gate voltage $V_{fg1}$ of conductor 2 decreases, Vout increases to counteract the decrease in floating gate voltage $V_{fg1}$. As $V_{fg1}$ increases, Vout decreases to counteract the increase in the floating gate voltage.

Thus, in the embodiment of FIG. 6, an active floating gate charge loss compensation technique provides continuous adjustment/compensation of the voltage on floating gate conductor 2 without any further programming.

Note that the floating gate conductor 2 and the other floating gate conductors described herein are completely isolated by oxide and should not be connected to any metal, because metal connected to a floating gate causes a loss of all of the charge trapped thereon. This is because the metal is enclosed by low temperature oxides such as PSG (Phosphorus silicate glass), BPSG (Boron-Phosphorus silicate glass), HDP oxide (High-density plasma), etc. These oxides are not conducive to long term data retention. All floating gates are made of poly which may withstand higher temperature processing and are generally enclosed by thermal oxides, TEOS (tetra-ethyl-ortho-silicate) or LPCVD (Low Pressure Chemical Vapor Deposition) oxides, which provide high quality isolation to thereby provide good data retention.

Thus, the present invention provides a floating gate structure that is shared among a sense transistor and various tunneling regions and/or storage capacitors and/or control gate capacitors, at least one of which is operated to increase or decrease the amount of charge trapped on the floating gate structure to provide compensation for undesirable loss of charge from the floating gate structure. Both passive charge loss and active charge loss compensation techniques are disclosed.

Use of either the passive or the active charge loss compensation technique avoids the need to provide additional complicated circuitry to compensate for loss of trapped floating gate charge due to various charge loss mechanisms.

The compensation technique of the present invention is based on the reference voltage calculations indicated below, in which the various voltage quantities and charge quantities are labeled as follows:

Vfg is the floating gate voltage,
Kcg is the control gate capacitance divided by total capacitance,
Vcg is the control gate voltage,
Ktg is the tunnel gate capacitance divided by total capacitance,
Vtg is the tunnel gate voltage,
Ks is the floating gate overlap of source capacitance,
Vss is the source voltage,
Kd is the floating gate overlap of drain capacitance,
Vsd is the drain voltage,
Kb is the floating gate overlap of transistor channel (bulk) capacitance,
Vbs is the bulk voltage,
Q is the charge on the floating gate, and
Ctotal is equal to the sum of the control gate capacitance, the tunnel gate capacitance, the source overlap capacitance, the drain overlap capacitance, and the bulk overlap capacitance.

Since Kcg is larger than the other coupling coefficients, the terms Kcg*Vcg+Q/Ctotal dominate in determining $V_{fg}$.

The charge on floating gate 12 is given by $$Q_{fg1} = C_{11}(V_{fg1} - \Phi_s - \Phi_{ms}) + C_{12}(V_{fg1} - V_{out}) + C_{13}(V_{fg1} - V_{m1}).\quad \text{Eq. 1}$$

In these equations, $V_{m1}$ and $V_{m2}$ are the voltages across the two tunneling regions to add or remove charge from the floating gate. $\Phi_s$ and $\Phi_{ms}$ are the semiconductor work function and the metal-semiconductor work function, respectively. The electric fields across the tunneling oxides will determine the Fowler Nordheim tunneling currents. For these calculations, it is assumed that there is only one tunnel capacitor, but tunnel capacitors may be added. (Note also that one skilled in the art may include additional parasitic capacitance to increase the accuracy of this model.)

Solving Equation 1 for $V_{fg1}$ results in $$V_{fg1} = [Q_{fg1} + C_{11}(\Phi_s + \Phi_{ms}) + C_{12}V_{out} + C_{13}V_{m1}]/(C_{11} + C_{12} + C_{13}).\quad \text{Eq. 2}$$

Figure 1:
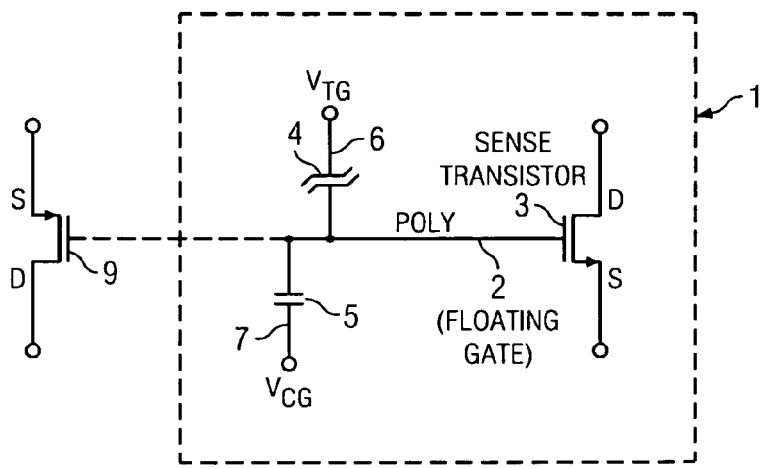
FIG. 1 is a schematic diagram including a conventional floating gate cell that may be used as a EEPROM cell or an AFG cell.
Figure 2:
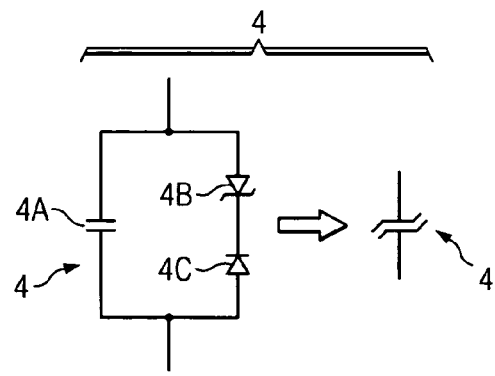
FIG. 2 shows an equivalent schematic diagram of a floating gate tunneling region and a corresponding circuit symbol thereof.
Figure 3:
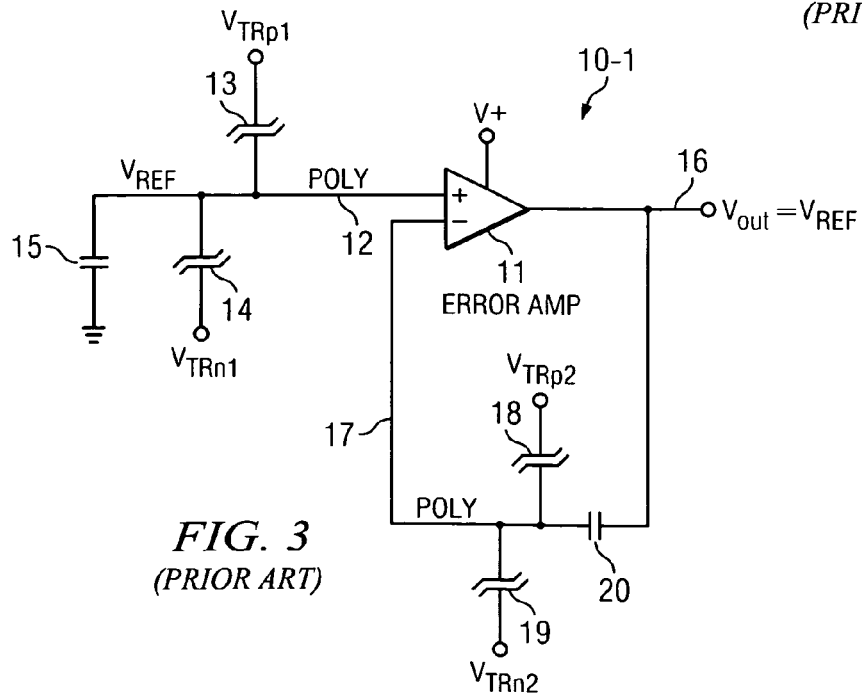
FIG. 3 illustrates a prior art AFG-based voltage reference circuit.
Figure 4:
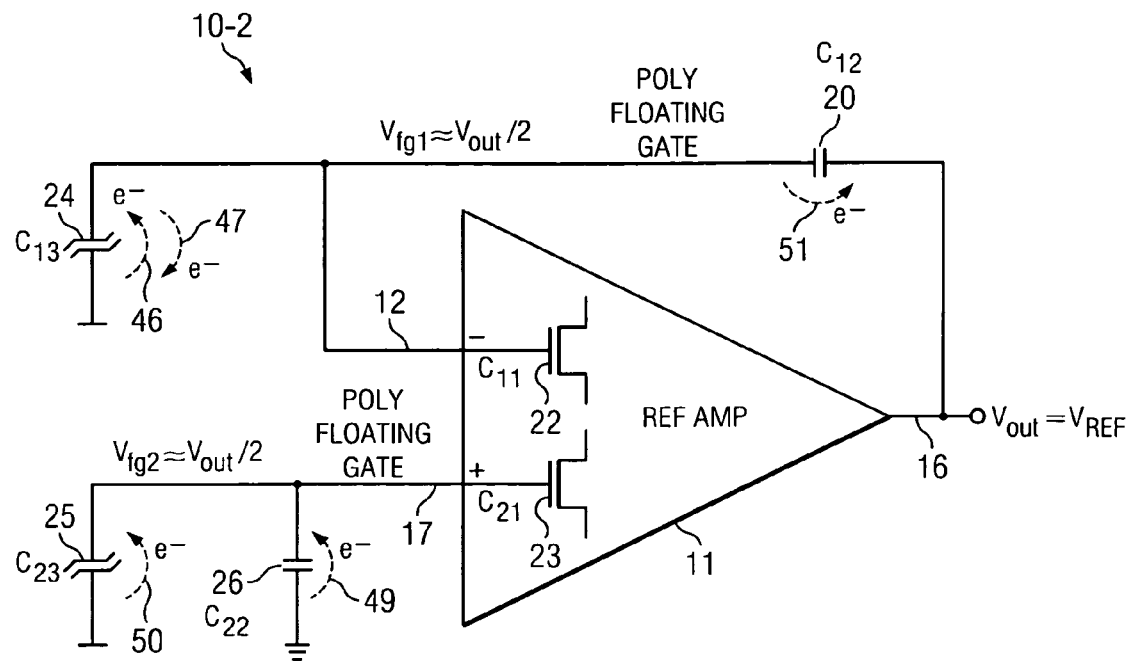
FIG. 4 is a schematic diagram that is useful in explaining analog floating gate charge loss in a conventional AFG reference voltage circuit due to power up and power down operations.

Similarly, the voltage $V_{fg2}$ on floating gate 14 in FIG. 4 is given by $$V_{fg2} = [Q_{fg2} + C_{21}(\Phi_s + \Phi_{ms}) + C_{22}V_{g2} + C_{23}V_{m2}]/(C_{21} + C_{22} + C_{23}).\quad \text{Eq. 3}$$

Since $V_{out} = G \times (V_{fg2} - V_{fg1})$, setting $V_{fg2} = V_{out}/G + V_{fg1}$ and $\alpha = \Phi_s + \Phi_{ms}$ results in $$V_{out}/G + [Q_{fg1} + C_{11}\alpha + C_{12}V_{out} + C_{13}V_{m1}]/C_{T1} = [Q_{fg2} + C_{21}\alpha + C_{22}V_{g2} + C_{23}V_{m2}]/C_{T2}.\quad \text{Eq. 4}$$

Solving for $V_{out}$ results in $$\{[(Q_{fg2}+C_{21}\alpha+C_{22}V_{g2}+C_{23}V_{m2})C_{T1}/C_{T2}]-Q_{fg1}-C_{11}\alpha-C_{13}V_{m1}\}/(C_{T1}/G+C_{12}).$$ Eq. 5

If $V_{tn2}=V_{tn1}=V_{g2}=0$, then $$V_{out}=\{[(Q_{fg2}+C_{21}\alpha)C_{T1}/C_{T2}]-Q_{fg1}-C_{11}\alpha\}/(C_{T1}/G+C_{12}).$$ Eq. 6

If $C_{T1}=C_{T2}$ and $C_{21}=C_{11}$, then $$V_{out}=(Q_{fg2}-Q_{fg1})/(C_{T1}/G+C_{12}).$$ Eq. 7

Floating gate stability depends on whether the charge losses in each of floating gates 12 and 17 are is equal. That is, if $\Delta Q=\Delta Q_{fg1}=\Delta Q_{fg2}$ is the charge loss, then $V_{out}$ is given by $$V_{out}=(Q_{fg2}+\Delta Q-(Q_{fg1}+\Delta Q))/(C_{T1}/G+C_{12})=(Q_{fg2}-Q_{fg1})/(C_{T1}/G+C_{12}),$$ Eq. 8 and $V_{out}$ will be stable. (However, due to asymmetries in the FN tunneling currents, it is not possible to make the FN currents symmetrical without creating a special purpose structure. In addition, special purpose structures require more costly processing and area. The present invention describes both passive and active methods by which the charge loss on a floating gate may be compensated, thereby reducing the level of charge loss/gain over the lifetime of the device.)

The charge loss calculations are as follows. The charge loss for floating gate 12 is $$\Delta Q_{fg1}=(A_{11}J_{11}(E_{11})+A_{12}J_{12}(E_{12})+A_{13}J_{13}(E_{13}))\times\Delta t,$$ Eq. 9 where $E_{11}$, $E_{12}$ and $E_{13}$ are the electric fields across the corresponding tunneling oxides, and are given by $$E_{11}=(V_{fg1}-\Phi_s-\Phi_{ms})/t_{ox}$$

$$E_{12}=(V_{fg1}-V_{out})/t_{ox}$$

$$E_{13}=(V_{fg1}-V_{m1})/t_{ox},$$

where $A_{11}$, $A_{12}$, and $A_{13}$ are the corresponding capacitor plate areas of the capacitors $C_{11}$, $C_{12}$, and $C_{13}$ respectively. $J_{11}$, $J_{12}$, and $J_{13}$ are the corresponding FN current densities of the capacitors $C_{11}$, $C_{12}$, and $C_{13}$, respectively.

Similarly, the charge loss for floating gate 17 is $$\Delta Q_{fg2}=(A_{21}J_{21}(E_{21})+A_{22}J_{22}(E_{22})+A_{23}J_{23}(E_{23}))\times\Delta t,$$ Eq. 10 where $E_{21}$, $E_{22}$ and $E_{23}$ are the electric fields across the corresponding tunneling oxides, and are given by $$E_{21}=(V_{fg2}-\Phi_s-\Phi_{ms})/t_{ox}$$

$$E_{22}=(V_{fg2}-V_{g2})/t_{ox}$$

$$E_{23}=(V_{fg2}-V_{m2})/t_{ox},$$

where $A_{21}$, $A_{22}$, and $A_{23}$ are the corresponding areas of capacitors $C_{21}$, $C_{22}$, and $C_{23}$, respectively. $J_{21}$, $J_{22}$, and $J_{23}$ are the corresponding FN current densities of the capacitors $C_{21}$, $C_{22}$, and $C_{23}$, respectively.

Note that the FNT current densities $J_{ij}$ depend on material properties and doping levels of the top and bottom plates of each FNT capacitor and on the dielectric used in each capacitor. In addition, FN tunneling depends on tunnel capacitance bias polarity, which determines whether electrons are injected from the top plate or bottom plate of tunnel capacitors. These FNT current densities $J_{ij}$ may be characterized and then used to set the charge on floating gate 28A (FIG. 5) in the passive embodiment of this invention or to determine the steps necessary in the algorithm for the active compensation (FIG. 6).

In the voltage reference circuit 10-3 of FIG. 5, it is likely to be impractical to balance charge losses of the two floating gates. For example, one might try to balance the difference in charge loss between tunneling capacitors by making the leakier tunneling capacitor smaller than the less leaky capacitor, for example by setting Area1/Area2=J2/J1) where J1 and Area1 are the cumulative FN current and tunneling area, respectively, for a first floating gate, and J2 and Area2 are the cumulative FN current and tunneling area floating gate, respectively, of a second floating gate. This is not likely to be practical because the currents J1 and J2 may be different by several orders of magnitude, and this would require several orders of magnitude difference in the tunnel capacitor areas. That would be likely to require an excessively large amount of silicon chip area. Consequently, there usually will be a need to compensate for charge loss on each of the individual floating gates 12 and 17 so that each does not lose a significant amount of charge over the lifetime of the voltage reference circuit 10-3.

The basic AFG algorithm of the present invention now may be described. First, the initial desired value $V_{out}$ is set. Then the initial desired value of $V_{fg2}$ is set by adjusting $Q_{fg2}$. Then the initial values for $V_{fg1}$ and $Q_{fg1}$ are determined by means of Equations 11 and 12:

$$V_{fg1}=V_{fg2}-V_{out}/G, \text{ and}$$ Eq. 11

$$Q_{fg1}=C_{T1}(V_{fg2}-V_{out}/G)-C_{11}\alpha-C_{12}V_{out}-C_{13}V_{m1}.$$ Eq. 12

Then, the floating gate charges are adjusted for each time increment (which, for example, may be 1 to 2 months) using the foregoing charge loss Equations 9 and 10.

Next, the new values of $Q_{fg1}$ and $Q_{fg2}$ are used to calculate new values of $V_{fg1}$ and $V_{fg2}$ using Equations 13 and 14:

$$V_{fg1}=[Q_{fg1}+C_{11}\alpha+C_{12}V_{out}+C_{13}V_{m2}]/C_{T1}, \text{ and}$$ Eq. 13

$$V_{fg2}=[Q_{fg2}+C_{21}\alpha+C_{22}V_{g2}+C_{23}V_{m2}]/C_{T2}.$$ Eq. 14

Then a new value of $V_{out}$ is computed using $$V_{out}=G(V_{fg2}-V_{fg1}).$$ Eq. 15

Finally, the foregoing steps involving Equations 13-15 are repeated for each time increment.

Thus, the present invention provides AFG compensation techniques and structures that compensate for the effects of charge loss due to various causes, and may therefore help make possible precision analog circuits that will retain their accuracy over a long product lifetime. The techniques and structures of the present invention avoid the need for complex downstream calibration circuitry and avoid the need for reprogramming/recalibration operations during the product lifetime. The present invention also avoids the need for additional masking steps during the integrated circuit fabrication processes. The invention is particularly useful in providing extremely low power the AFG circuitry using integrated circuit fabrication processes which do not include the capability of providing a very thick oxide.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although examples of use of the present invention in voltage reference circuit/amplifiers have been set forth therein, the compensation techniques of the present invention may be readily used in other kinds of circuits, e.g., current mirrors.

What is claimed is:

1. An AFG (analog floating gate) circuit, comprising:
   (a) a first sense transistor;
   (b) a first storage capacitor;
   (c) first and second tunneling regions;
   (d) various portions of a first floating gate conductor forming a floating gate of the first sense transistor, a floating first plate of the first storage capacitor, a floating first plate of the first tunneling region, and a floating first plate of the second tunneling region, respectively, a second plate of the first storage capacitor being coupled to a first reference voltage, and a second plate of the second tunneling region being coupled to a second reference voltage; and
   (e) compensation circuitry coupled to the first floating gate conductor, for compensating loss of charge on the first floating gate conductor,
   wherein the compensation circuitry includes passive compensation circuitry which sets a redetermined voltage on the second plate of the first tunneling region in response to a fixed voltage and functions as a reserve source of charge from which to compensate loss of charge on the first floating gate conductor.

2. The AFG circuit of claim 1 wherein the compensation circuitry is active compensation circuitry operative in response to a voltage of the first floating gate conductor.

3. The AFG circuit of claim 1 wherein the first sense transistor is an amplifier input transistor of an amplifier.

4. The AFG circuit of claim 2 wherein the active compensation circuitry includes a floating gate input transistor for determining a voltage of the first floating gate conductor, a floating gate of the floating gate input transistor being formed by a portion of the first floating gate conductor.

5. The AFG circuit of claim 1 wherein the compensation circuitry includes a passive compensation circuit having a first capacitor coupled between the first reference voltage and the second plate of the first tunneling region, the second plate of the first tunneling region being a portion of a second floating gate conductor.

6. The AFG circuit of claim 5 wherein the passive compensation circuit includes the second floating gate conductor coupled to the second plate of the first tunneling region, a third tunneling region having a first plate coupled to the second floating gate conductor and a second plate coupled to the second reference voltage, and a second storage capacitor having a first plate coupled to the second floating gate conductor and a second plate coupled to a third reference voltage.

7. The AFG circuit of claim 6 wherein the passive compensation circuit includes a fourth tunneling region having a first plate coupled to the second floating gate conductor and a second plate coupled to a second reference voltage.

8. The AFG circuit of claim 7 wherein the first sense transistor is a first input transistor of an amplifier, the amplifier also including a second sense transistor which is a second input transistor of the amplifier, various portions of a third floating gate conductor forming a floating gate of the second sense transistor, a floating first plate of a second storage capacitor, a floating first plate of a fifth tunneling region, and a floating first plate of a sixth tunneling region, respectively, a second plate of the second storage capacitor being coupled to the third reference voltage, and a second plate of the sixth tunneling region being coupled to the third reference voltage, wherein the compensation circuit includes a fourth floating gate conductor coupled to the second plate of the fifth tunneling region, a seventh tunneling region having a first plate coupled to the fourth floating gate conductor and a second plate coupled to the second reference voltage, a fourth storage capacitor having a first plate coupled to the fourth floating gate conductor and a second plate coupled to the third reference voltage, and an eighth tunneling region having a first plate coupled to the fourth floating gate conductor and a second plate coupled to the second reference voltage.

9. The AFG circuit of claim 1 wherein the first storage capacitor is a thick oxide capacitor having an oxide thickness substantially greater than a thickness of tunneling oxides of the first and second tunneling regions.

10. The AFG circuit of claim 9 wherein the tunneling oxides have thicknesses in the range of approximately 70 angstroms to approximately 120 angstroms.

11. The AFG circuit of claim 3 wherein the amplifier is an error amplifier of a voltage reference circuit and wherein the first storage capacitor is a feedback capacitor coupled between the first floating gate conductor and an output of the amplifier.

12. The AFG circuit of claim 9 wherein voltages and charges on the second floating gate conductor are sufficient to cause the second tunneling region to compensate for loss of trapped charge from the first floating gate conductor over a desired product lifetime.

13. The AFG circuit of claim 1 wherein the active compensation circuitry operates in response to a voltage of the first floating gate conductor to adjust a voltage of the second plate of the first tunneling region so as to automatically reduce an error in the voltage of the floating plate conductor due to loss of trapped charge from the floating gate conductor.

14. A method of compensating charge loss from a floating gate conductor of an AFG (analog floating gate) circuit, the method comprising:
   (a) providing a sense transistor, a first storage capacitor, and first and second tunneling regions, various portions of a first floating gate conductor forming a floating gate of the sense transistor, a floating first plate of the first storage capacitor, a floating first plate of the first tunneling region, and a floating first plate of the second tunneling region, respectively, a second plate of the first storage capacitor being coupled to a first reference voltage, and a second plate of the second tunneling region being coupled to the first reference voltage; and
   (b) coupling compensation circuitry to a second plate of the first tunneling region to provide a source of charge through the first tunneling region to compensate loss of trapped charge from the first floating gate conductor,
   wherein step (b) includes setting a predetermined voltage on the second plate of the first tunneling region by means of passive capacitor divider compensation circuitry which functions as a reserve source of charge from which charge may tunnel as needed through the first tunneling region to the first floating gate conductor.

15. The method of claim 14 wherein step (b) includes coupling a second storage capacitor between a second reference voltage and the second plate of the first tunneling region, the second plate of the first tunneling region being a portion of a floating gate compensation conductor coupled to the second plate of the first tunneling region.

16. The method of claim 14 wherein step (b) includes operating active compensation circuitry in response to a voltage of the first floating gate conductor to adjust a voltage of the second plate of the first tunneling region so as to automatically reduce an error in the voltage of the floating plate conductor due to loss of trapped charge from the floating gate conductor.

17. The method of claim 14 wherein step (b) automatically adjusts an electric field across the first tunneling region so as to provide compensation for leakage of charge from the first floating gate conductor over a desired product lifetime.

18. An AFG (analog floating gate) circuit, comprising:
(a) a sense transistor, a first storage capacitor, and first and second tunneling regions, various portions of a first floating gate conductor forming a floating gate of the sense transistor, a floating first plate of the first storage capacitor, a floating first plate of the first tunneling region, and a floating first plate of the second tunneling region, respectively, a second plate of the first storage capacitor being coupled to a first reference voltage, and a second plate of the second tunneling region being coupled to the first reference voltage; and
(b) means for coupling compensation circuitry to a second plate of the first tunneling region to provide a source of charge through the first tunneling region to compensate loss of trapped charge from the first floating gate conductor,
wherein the compensation circuitry includes passive compensation circuitry which sets a predetermined voltage on the second plate of the first tunneling region in response to a fixed voltage and functions as a reserve source of charge from which to compensate loss of charge on the first floating gate conductor.

\* \* \* \* \*